US011102879B2

(12) United States Patent
Olivadese et al.

(10) Patent No.: US 11,102,879 B2
(45) Date of Patent: Aug. 24, 2021

(54) PRINTED CIRCUIT BOARD TO DIELECTRIC LAYER TRANSITION WITH CONTROLLED IMPEDANCE AND REDUCED AND/OR MITIGATED CROSSTALK FOR QUANTUM APPLICATIONS

(71) Applicant: International Business Machines Corporation, Armonk, NY (US)

(72) Inventors: Salvatore Bernardo Olivadese, Stamford, CT (US); Patryk Gumann, Tarrytown, NY (US); Nicholas Torleiv Bronn, Long Island City, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/136,855

(22) Filed: Sep. 20, 2018

(65) Prior Publication Data

US 2020/0100357 A1 Mar. 26, 2020

(51) Int. Cl.
  *H01L 27/18* (2006.01)
  *H01L 39/02* (2006.01)
  (Continued)

(52) U.S. Cl.
  CPC .......... *H05K 1/0243* (2013.01); *G06N 10/00* (2019.01); *H01L 27/18* (2013.01); *H01L 39/025* (2013.01); *H01L 39/223* (2013.01)

(58) Field of Classification Search
  CPC ............................. H01L 27/18; H05K 1/0243
  (Continued)

(56) References Cited

U.S. PATENT DOCUMENTS 5,135,556 A    8/1992   Hornback et al.
5,459,284 A    10/1995   Bockelman et al.
(Continued)

FOREIGN PATENT DOCUMENTS

CN    201802588 U    4/2011
CN    201803392 U    4/2011
(Continued)

OTHER PUBLICATIONS

International Search Report and Written Opinion received for PCT Application Serial No. PCT/EP2019/074333 dated Dec. 6, 2019, 16 pages.

(Continued)

*Primary Examiner* — Moazzam Hossain
*Assistant Examiner* — Hajar Kolahdouzan
(74) *Attorney, Agent, or Firm* — Amin, Turocy & Watson, LLP

(57) ABSTRACT

A transition between a printed circuit board and a dielectric layer with controlled impedance and reduced and/or mitigate crosstalk for quantum applications are provided. A quantum device can comprise a microwave quantum circuit on a dielectric substrate and a printed circuit board comprising a via that comprises a transmission line. A wirebond between the transmission line of the printed circuit board and a transmission line of the microwave quantum circuit operatively couples the microwave quantum circuit to the printed circuit board. The via comprises a defined characteristic impedance. The wirebond provides a microwave signal connection between the printed circuit board and the microwave quantum circuit.

25 Claims, 15 Drawing Sheets

(51) Int. Cl.
*H05K 1/02* (2006.01)
*G06N 10/00* (2019.01)
*H01L 39/22* (2006.01)

(58) Field of Classification Search
IPC .................. H05K 1/0243,1/183, 1/181, 1/025, H05K 1/184, 2201/2036, 2201/10371, 2201/09481, 2203/049; H01L 39/223, 39/025, 27/18; G06N 10/00
See application file for complete search history.

(56) References Cited

U.S. PATENT DOCUMENTS

| | | | |
|---|---|---|---|
| 5,471,010 | A | 11/1995 | Bockelman et al. |
| 7,400,222 | B2 | 7/2008 | Kwon et al. |
| 7,667,321 | B2 | 2/2010 | Rebelo et al. |
| 7,863,716 | B2 | 1/2011 | Ali et al. |
| 8,115,509 | B2 | 2/2012 | Takada |
| 8,159,313 | B2 | 4/2012 | Uchaykin |
| 8,315,678 | B2 | 11/2012 | Uchaykin |
| 8,441,329 | B2 | 5/2013 | Thom et al. |
| 8,558,398 | B1 | 10/2013 | Seetharam |
| 9,024,417 | B2 | 5/2015 | Rollin et al. |
| 9,520,547 | B2 | 12/2016 | Abraham et al. |
| 9,520,853 | B2 | 12/2016 | Laighton et al. |
| 9,647,662 | B1 | 5/2017 | Abutaleb et al. |
| 9,826,622 | B2 | 11/2017 | Kuemmeth et al. |
| 10,043,136 | B1 | 8/2018 | Abdo |
| 2002/0118528 | A1* | 8/2002 | Su ....................... H01L 24/48 361/800 |
| 2006/0043587 | A1 | 3/2006 | Lim et al. |
| 2006/0065983 | A1 | 3/2006 | Chia et al. |
| 2009/0321897 | A1* | 12/2009 | Ali ....................... H01L 24/49 257/659 |
| 2016/0292587 | A1 | 10/2016 | Rigetti et al. |
| 2017/0257074 | A1 | 9/2017 | Yeh et al. |
| 2018/0102470 | A1* | 4/2018 | Das ..................... H01L 39/2493 |
| 2018/0294401 | A1 | 10/2018 | Tuckerman |

FOREIGN PATENT DOCUMENTS

| | | |
|---|---|---|
| JP | S63-288034 A | 11/1988 |
| WO | 2009/086430 A2 | 7/2009 |

OTHER PUBLICATIONS

Colless et al., "Modular Cryogenic Interconnects for Multi-Qubit Devices", arxiv. org, May 14, 2014, 6 pages.

Colless et al., "Cryogenic High-Frequency Readout and Control Platform for Spin Quibts", XP012161865, vol. 83, No. 2, Feb. 1, 2012, 7 pages.

https://www.bluefors.com/index.php/xld-series, Last accessed Feb. 26, 2019, 14 Pages.

George et al., "Multiplexing Superconducting Qubit Circuit for Single Microwave Photon Generation", J Low Temp Phys, Jul. 5, 2017, vol. 189, pp. 60-75.

Krinner et al., Engineering cryogenic setups for 100-qubit scale superconducting circuit systems, Jun. 20, 2018, 31 Pages.

https://nanoscience.oxinst.com/products/cryofree-dilution-refrigerators/tritonxl, Last accessed Feb. 27, 2019, 8 Pages.

Mariantoni et al., "Photon shell game in three-resonator circuit quantum electrodynamics," Nature Physics, Jan. 2011, vol. 7, pp. 287-293, Macmillan Publishers Limited, 7 pages.

Bronn et al., "High Coherence Plane Breaking Packaging for Superconducting Qubits," Feb. 14, 2018, arXiv:1709.02402v2 [quant-ph], 9 pages.

List of IBM Patents or Applications Treated as Related.

* cited by examiner

PRINTED CIRCUIT BOARD TO DIELECTRIC LAYER TRANSITION WITH CONTROLLED IMPEDANCE AND REDUCED AND/OR MITIGATED CROSSTALK FOR QUANTUM APPLICATIONS

BACKGROUND

Crosstalk in electronic devices can occur when a signal transmitted on a first circuit or a first channel of a transmission line (or system) creates an unintended material impact in a second circuit or a second channel. The crosstalk can be caused by electric fields or magnetic fields of a first communication signal affecting a second communication signal in one or more adjacent circuits. For supercomputing devices (e.g., where crosstalk tolerance is highly sensitive), the impact of crosstalk can significantly increase the risk of corrupted signals and can lead to unpredictable circuit behavior and/or faulty circuit behavior.

When utilizing supercomputing technology devices, several specific sections of potential crosstalk impact can be observed. These sections can include device packaging, such as a printed circuit board (PCB), a quantum chip dielectric layer on a dielectric substrate (DIE), and/or wirebonds that connect the package to the quantum chip dielectric layer. The wirebonds can be very close in physical proximity to adjacent wirebonds and, therefore, can increase distortion and/or crosstalk of adjacent wirebond signals due to electromagnetic interference and/or voltage leakage.

A problem associated with quantum (e.g., superconducting) applications is that wirebonds are utilized to connect printed circuit board lines to chip components on a dielectric layer, transmission lines on a dielectric substrate, and/or transmission lines on a different dielectric substrate. Further, an increase in the number of qubits has a corresponding increase in the number of connections (e.g., wirebonds) that are needed in close proximity of one another. This can introduce undesired cross-communication (e.g., crosstalk or xtalk) between near wirebonds. In addition, the transition from printed circuit board to the components and/or transmission lines of a dielectric layer does not preserve characteristic impedance continuity.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein are devices, systems, methods, computer-implemented methods, apparatuses, and/or computer program products that facilitate printed circuit board to dielectric layer transition with controlled impedance and reduced and/or mitigated crosstalk for quantum applications.

According to an embodiment, a quantum device can comprise a microwave quantum circuit on a dielectric substrate and a printed circuit board comprising a via that comprises a transmission line. A wirebond between the transmission line of the printed circuit board and a transmission line of the microwave quantum circuit can operatively couple the microwave quantum circuit to the printed circuit board. Further, the via can comprise a defined characteristic impedance. An advantage of such a quantum device is that the via can be designed to a defined impedance, which can preserve characteristic impedance continuity.

In some examples, the dielectric substrate can be formed over the printed circuit board. In other examples, the dielectric substrate can be formed, at least partially, inside the printed circuit board. In yet other examples, the device can comprise a cover that supports the printed circuit board and the dielectric substrate. An advantage of such a quantum device is that a length of the wirebond is based on the distance between the via and the dielectric substrate, which provides for a shorter wirebond and, therefore, a reduction and/or mitigation of crosstalk since crosstalk is proportional to the length of the wirebond.

According to an embodiment, provided is a method that can comprise filling a via in a printed circuit board with a transmission line. The via can comprise a defined characteristic impedance. Further, the method can comprise operatively coupling the printed circuit board to a microwave quantum circuit on a dielectric substrate via a wirebond between the transmission line of the printed circuit board and a transmission line of the microwave quantum circuit. An advantage of such a method is that the via can be designed to a defined characteristic impedance, which can preserve characteristic impedance continuity.

In some examples, operatively coupling the printed circuit board to the microwave quantum circuit can comprise attaching a length of the wirebond to the printed circuit board and the microwave quantum circuit. The length can be determined as a function of a first location of the via and a second location of the microwave quantum circuit. An advantage of such a method is that signal crosstalk is directly related to a length of the wirebond. Therefore, controlling the placement of the first location and the second location can decrease the length of the wirebond and, thus, can reduce and/or mitigate crosstalk.

According to an embodiment, provided is an integrated circuit that can comprise a microwave quantum circuit on a dielectric substrate and a printed circuit board comprising a via that comprises a transmission line. The printed circuit board can be operatively coupled to the microwave quantum circuit via a wirebond between the transmission line of the printed circuit board and a transmission line of the microwave quantum circuit. Further, the via can comprise a defined characteristic impedance. An advantage of such an integrated circuit is that the via can be designed to a defined characteristic impedance, which can preserve characteristic impedance continuity.

According to a further embodiment, provided is a device package that can comprise a printed circuit board comprising a first via comprising a first transmission line and a second via comprising a second transmission line. The first via can comprise a first defined characteristic impedance and the second via can comprise a second defined characteristic impedance. The device package can also comprise a microwave quantum circuit on a dielectric substrate formed over the printed circuit board. The microwave quantum circuit can be operatively attached to the printed circuit board via a first wirebond between the first transmission line of the printed circuit board and a first transmission line of the microwave quantum circuit and via a second wirebond between the second transmission line of the printed circuit board and a second transmission line of the microwave quantum circuit. An advantage of such a device package is that the via can be designed to a defined impedance, which can preserve characteristic impedance continuity.

In accordance with another embodiment, provided is a device package that can comprise a printed circuit board comprising a first via comprising a first transmission line and a second via comprising a second transmission line. The first via can comprise a first defined characteristic impedance and the second via can comprise a second defined characteristic impedance. The device package can also comprise a microwave quantum circuit on a dielectric substrate formed, at least in part, inside the printed circuit board. The microwave quantum circuit can be operatively coupled to the printed circuit board via a first wirebond between the first transmission line of the printed circuit board and a first transmission line of the microwave quantum circuit and a second wirebond between the second transmission line of the printed circuit board and the microwave quantum circuit. An advantage of such a device package is that the via can be designed to a defined impedance, which can preserve characteristic impedance continuity. A further advantage of such a device package is that a length of the wirebond is based on the distance between the via and the dielectric substrate, which provides for a shorter wirebond and, therefore, a reduction and/or mitigation of crosstalk since crosstalk is proportional to the length of the wirebond.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1B:
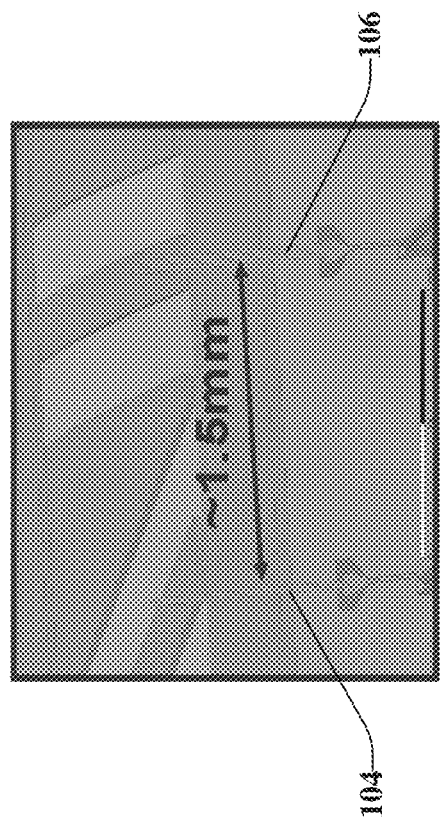
FIG. 1B illustrates a detailed example of portion of a quantum chip circuit in accordance with one or more embodiments described herein.
Figure 1A:
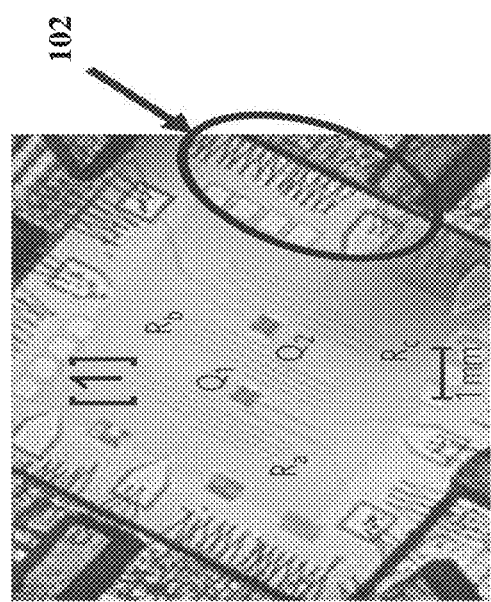
FIG. 1A illustrates a quantum chip circuit that comprises wirebonds in accordance with one or more embodiments described herein.

As it relates to circuits, and more specifically quantum circuits, wirebonds are utilized to connect printed circuit board (PCB) transmission lines to dielectric substrate (DIE) components. For purposes of explanation, FIG. 1A illustrates a quantum chip circuit (denoted as [1]) that comprises wirebonds, illustrated within circle 102 in accordance with one or more embodiments described herein. Wirebonds are transition connection wires located between dielectric layer lines and printed circuit board lines. For example, when there is a quantum processor or a quantum device, the processor or device can be connected through tiny wirebonds (e.g., tiny wires made of aluminum or another material) that connect both the ground plane of the printed circuit board (which is surrounding the quantum processor) and the components on the dielectric layer. Additionally, or alternatively, the wirebonds can be used to connect the transmission lines of the printed circuit board to the transmission lines on the quantum processor itself, which is illustrated in FIG. 1B, which illustrates a detailed example of a portion of a quantum chip circuit in accordance with one or more embodiments described herein.

A challenge that can develop with quantum devices is that the wirebonds are very close to each other between transmission lines and can increase in number and become closer to one other when the number of qubits or other components on the quantum processor are increased. The closer the wirebonds get; the more connection or crosstalk is generated between the wirebonds. This means that when a signal is sent through a first wirebond 104, some parts of the signal can leak to the other wirebonds (e.g., a second wirebond 106) that is near the first wirebond 104 and based on their magnetic electric coupling. As illustrated in FIG. 1B, the first wirebond 104 and the second wirebond 106 are separated by a distance of approximately 1.5 millimeters (mms), however, other distances can be utilized to separate wirebonds. An increase in the number of qubits results in an increase in the number of connections (e.g., wirebonds) that are in close proximity to one another. This close proximity can introduce undesired cross-communication (e.g., crosstalk or xtalk) between near wirebonds (e.g., the first wirebond 104 and the second wirebond 106). The crosstalk situation should be avoided because when a first qubit is controlled through signaling, a status of a second qubit (or statuses of other qubits) should not be accidently altered based on crosstalk received from the signal controlling the first qubit.

Figure 1C:
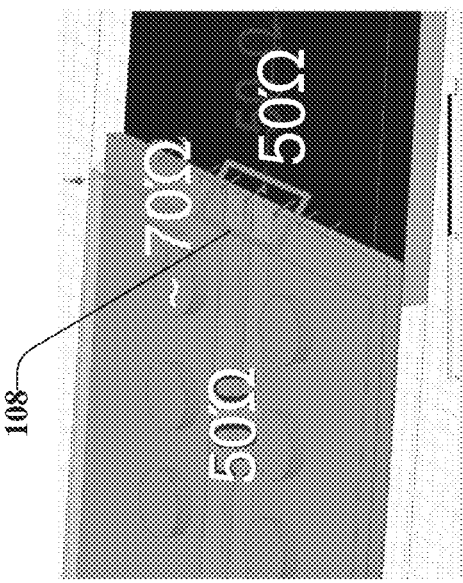
FIG. 1C illustrates a transition from a printed circuit board line to a transmission line on a dielectric layer that does not preserve characteristic impedance continuity in accordance with one or more embodiments described herein.

Further, as illustrated in FIG. 1C, a transition from a printed circuit board line to a transmission line on the dielectric layer (e.g., through the one or more wirebonds as indicated at 108) does not preserve characteristic impedance continuity. For example, in conventional devices the transmission from the printed circuit board to the transmission line on the dielectric layer is not matched in terms of characteristic impedance. As illustrated, the printed circuit board and the dielectric layer can be designed to a first impedance (e.g., 50 ohms), while the transition (at 108) can be at a second impedance (e.g., around 70 ohms). This means that some part of the signal might be reflected back when it goes through the wirebond. The input lines are usually 50 ohms (which can be the standard for microwave components), the same is designed on the quantum device for transmission lines but unfortunately, the wirebonds themselves cannot be fully controlled to be 50 ohms. As illustrated, the transition is, in most cases around 70 ohms, which can introduce some noise or issues into the design.

Figure 7:
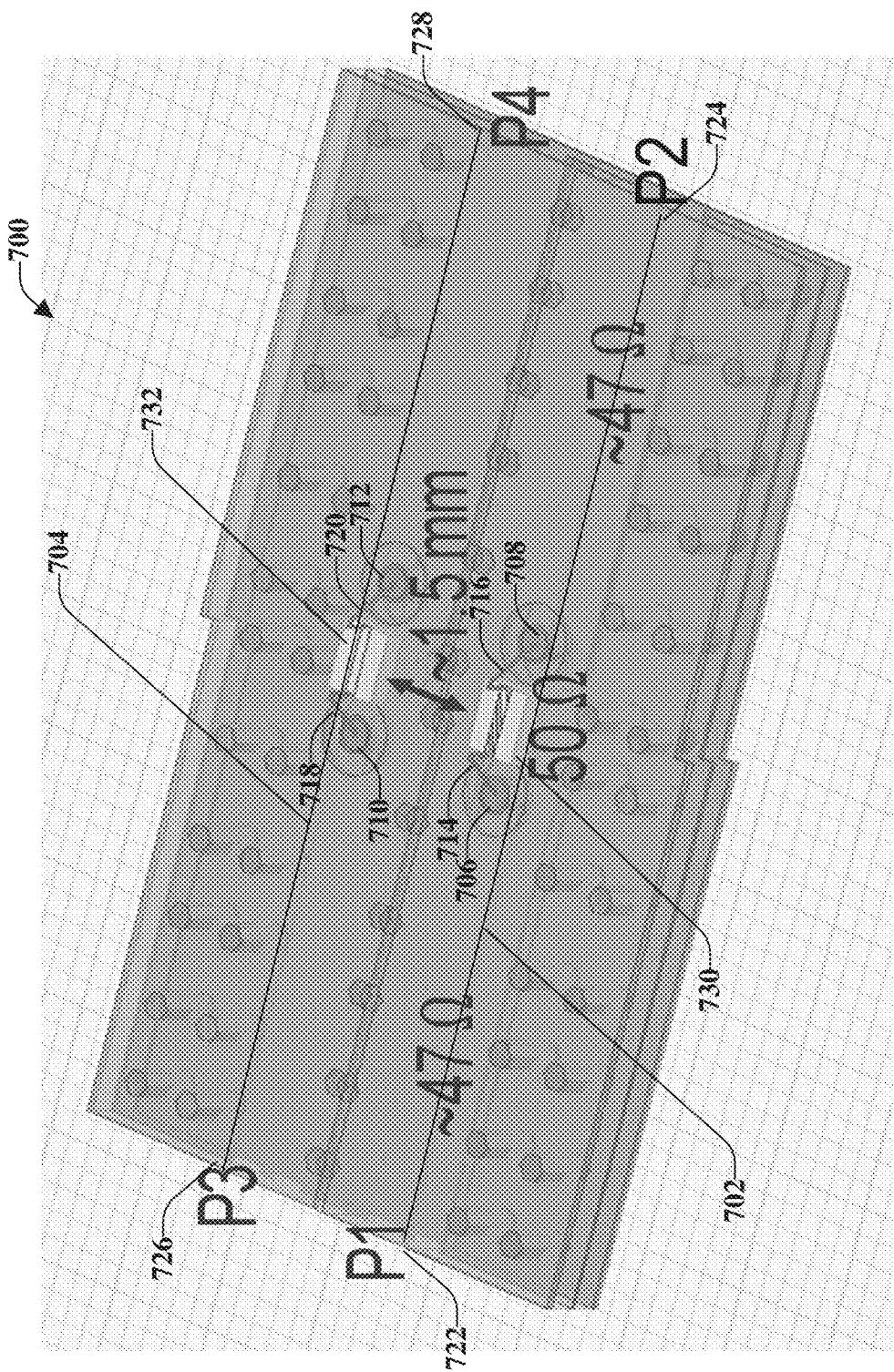
FIG. 7 illustrates an example, non-limiting, printed circuit board utilized in a simulation in accordance with one or more embodiments described herein.
Figure 8:
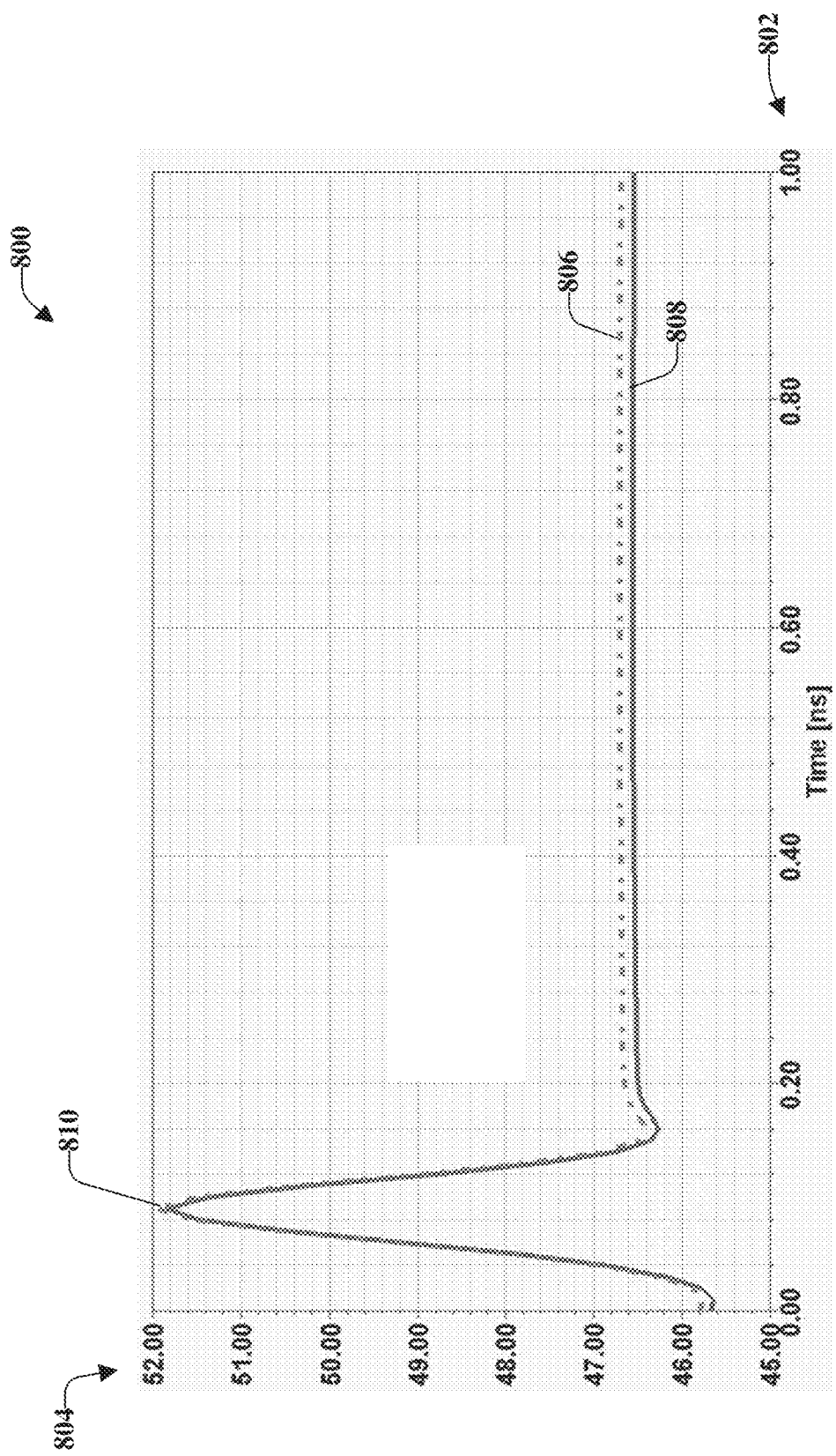
FIG. 8 illustrates an example, non-limiting, graph of time domain reflectometry results of the simulation of the printed circuit board of FIG. 7 in accordance with one or more embodiments described herein.
Figure 9:
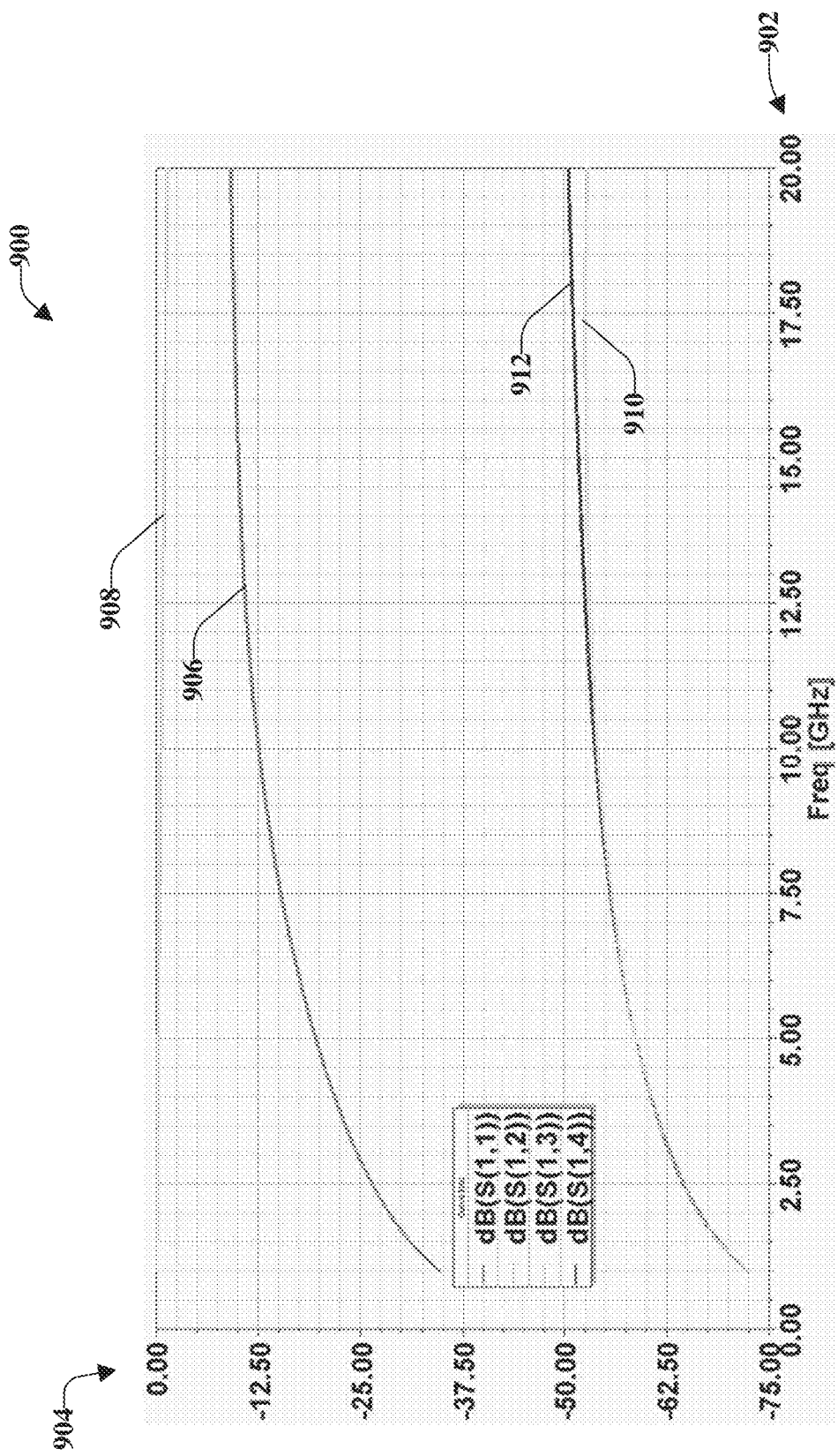
FIG. 9 illustrates an example, non-limiting, graph of scattering parameter results of the simulation of the printed circuit board of FIG. 7 in accordance with one or more embodiments described herein.

An issue the disclosed aspects addresses is reducing and/or mitigating a negative impact of "crosstalk" in a superconductor device. Superconducting qubits can operate within a small bandwidth (e.g., 100 MHz) near the 5 GHz range, and additional components for control of the qubits can operate between about 6 GHz to around 10 GHz. Simulations discussed in the upcoming drawings plot crosstalk results within a range between 1 GHz and 20 GHz (as shown in FIGS. 7, 8, and 9). Crosstalk has become a critical destructive source to performance degradation and signal integrity problems in design of high-speed printed circuit boards and worsens with higher frequencies. Since transmission lines typically need to be close in proximity due to high density of interconnections within a superconducting device, risk of corrupting one signal from an adjacent line becomes highly probable. Common symptoms of crosstalk are re-transmissions, which can cause significant random slowdowns leading to unpredictable results and potential failure of a circuit.

There have been some attempts undertaken to mitigate crosstalk. Concepts have been applied such as proposed various signal routing topologies to reduce and/or mitigate crosstalk between adjacent lines, however, this increases a footprint required on a printed circuit board. Further, other attempts such as driver sizing, wire spacing, defined wirebond arrangements, optical specific technology, along with simultaneously buffering and routing have been developed to reduce and/or mitigate crosstalk noise. However, such attempts do not address the problem of reducing and/or mitigating crosstalk while preserving characteristic impedance continuity, as will be discussed in further detail below.

In addition, these existing solutions do not achieve a crosstalk reduction and/or mitigation near negative 50 dB (−50 dB) because for classical applications in the semiconductor industry, −30 dB is considered sufficient for a quality signal. Some of these potential solutions can be implemented after circuit design. However, an objective of the disclosed aspects is to design into a circuit mitigating features prior to fabrication.

Figure 2:
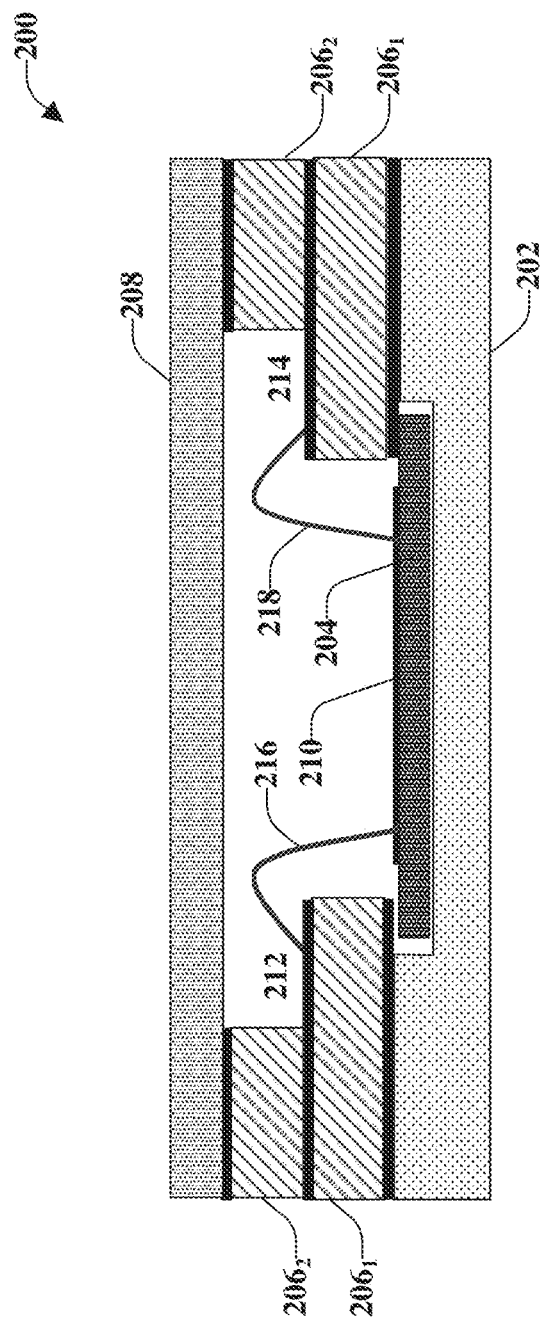
FIG. 2 illustrates an example, non-limiting, side-view of a portion of a quantum device in accordance with one or more embodiments described herein.

FIG. 2 illustrates an example, non-limiting, side-view of a portion of a quantum device 200 in accordance with one or more embodiments described herein. As illustrated the quantum device 200 comprises a bottom cover 202, which can be formed of copper or another material. Also included in the quantum device 200 can be a dielectric layer (e.g., a dielectric substrate 204) and a printed circuit board 206, illustrated as comprising a first layer $206_1$ and a second layer $206_2$, which is over the first layer $206_1$. The quantum device 200 also comprises a top cover 208, which can be formed of copper or another material.

To create a transition from the printed circuit board 206 to a microwave quantum circuit 210 on the dielectric substrate 204, one or more portions of the printed circuit board 206 can be cut away. For example, portions of the second layer $206_2$ can be cut, as illustrated at 212 and 214. Thus, instead of the first layer $206_1$ and the second layer $206_2$ being substantially the same length, the second layer $206_2$ is cut to accommodate one or more wirebonds. A first wirebond 216 can extend from the first cut portion 212 of the printed circuit board 206 (e.g., the second layer $206_2$) to one or more components (e.g., the microwave quantum circuit 210) on the dielectric substrate 204. Further, a second wirebond 218 can extend from the second cut portion 214 of the printed circuit board 206 (e.g., the second layer $206_2$) to one or more components (e.g., the microwave quantum circuit 210, one or more transmission lines) on the dielectric substrate 204.

The cut portions of the printed circuit board 206 (e.g., the second layer $206_2$), illustrated at 212 and 214, are a reason why the transitions are not 50-ohm matched, which is another problem associated with traditional quantum devices. The transitions are not 50-ohm matched because when the cut is created, there is no way to control the characteristic impedance accurately. In addition, the length of the wirebonds (e.g., the first wirebond 216, the second wirebond 218) from a top of the printed circuit board (e.g., at 212 and 214) to the dielectric substrate 204 can increase the inaccuracy of the characteristic impedance of the transition. To overcome these problems, the disclosed aspects provide a quantum device that comprises one or more vias designed to defined impedances, which can preserve characteristic impedance continuity.

In addition, the quantum device of FIG. 2 does not provide the level of isolation between wirebonds that is needed for quantum applications. The reason is that in order to decouple two qubits between one other, an isolation below minus 50 dB (−50 dB) is necessary. Although the device of FIG. 2 is used to isolate wirebonds that are close to one another, the design of the device does not take into account the lack of characteristic impedance continuity in the transition, as discussed with respect to FIG. 1C. Even though the device of FIG. 2 can reduce and/or mitigate crosstalk, the crosstalk still does not improve the 50-ohm condition, as provided with the disclosed aspects.

Figure 3:
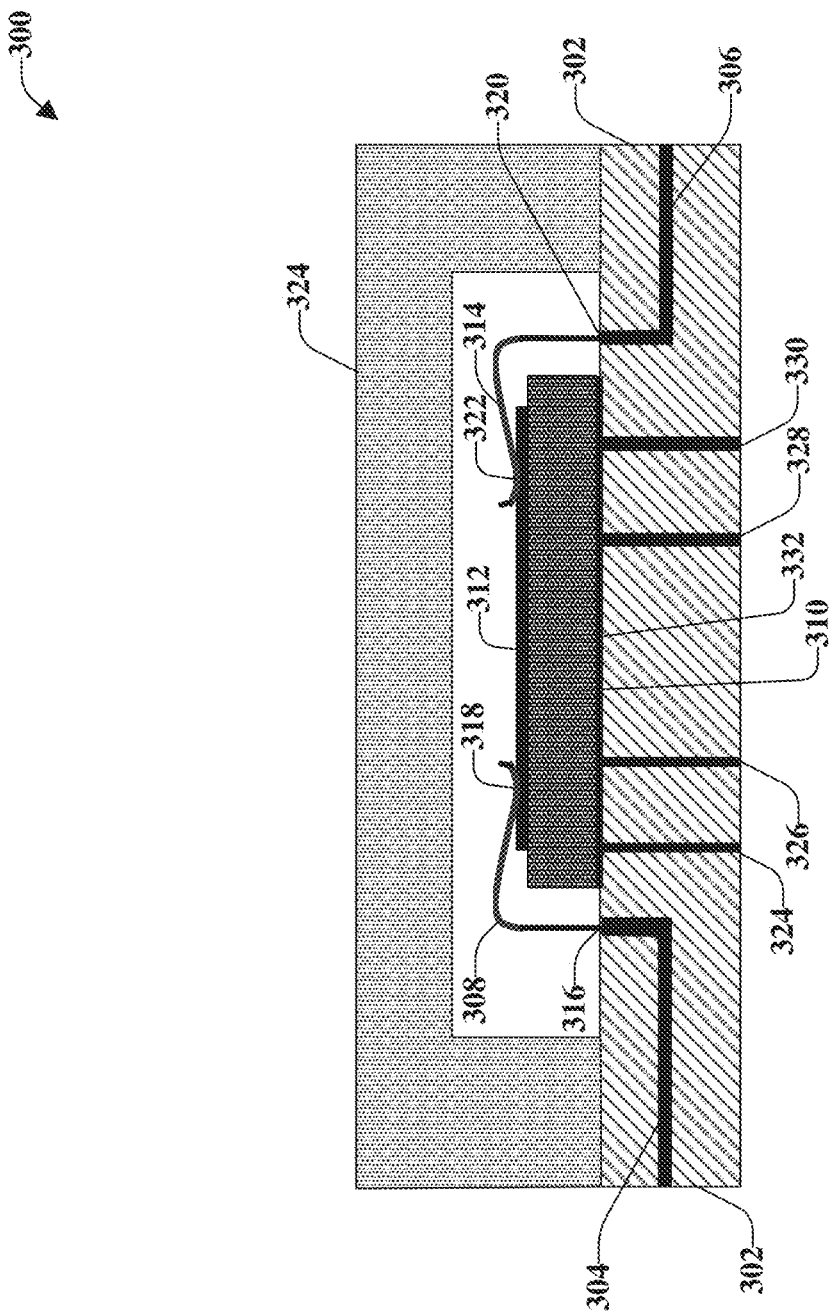
FIG. 3 illustrates an example, non-limiting, side-view of a portion of a quantum computing device in accordance with one or more embodiments described herein.

FIG. 3 illustrates an example, non-limiting, side-view of a portion of a quantum computing device 300 in accordance with one or more embodiments described herein. Repetitive description of like elements employed in other embodiments described herein is omitted for sake of brevity. The quantum computing device 300 (as well as other quantum devices discussed herein) can be a superconducting device, can be implemented on a printed circuit board, in an integrated circuit, and/or in a superconductor package.

As illustrated, the quantum computing device 300 can comprise a printed circuit board 302, which can be a single layer printed circuit board. As discussed with respect to FIG. 2, a problem associated with traditional quantum devices (e.g., the quantum device 200) is that the printed circuit board (e.g., the printed circuit board 206, the second layer $206_2$) has to be cut, as illustrated at 212 and 214 of FIG. 2, to make a connection or contact point for the wirebonds. A solution provided by the quantum devices discussed herein is that one or more vias can be formed inside the printed circuit board 302 eliminating the need to cut away a portion of the printed circuit board. The one or more vias can be formed using a via forming process. The vias of the quantum computing device 300 are illustrated as a first via 304 and a second via 306.

Transmission lines can be formed in the one or more vias (e.g., the first via 304, the second via 306). For example, the first via 304 can comprise a first transmission line and the second via 306 can comprise a second transmission line. A first wirebond 308 can connect the first via 304 to a dielectric layer (e.g., a dielectric substrate 310) and/or to one or more components (e.g., a microwave quantum circuit 312, one or more transmission lines, a second transmission line) located on the dielectric substrate 310. A second wirebond 314 can connect the second via 306 to the dielectric substrate 310 and/or to one or more components (e.g., a microwave quantum circuit 312, one or more transmission lines, such as a second transmission line) located on the dielectric substrate 310.

The first wirebond 308 and the second wirebond 314 can provide a microwave signal connection between the printed circuit board 302 and the microwave quantum circuit 312. According to some implementations, the first wirebond 308 and the second wirebond 314 can provide a microwave signal connection between the printed circuit board 302 chip components on the dielectric layer (DIE), lines on the dielectric layer (DIE), and/or a different dielectric substrate (DIE).

A first length of the first wirebond 308 can based on a first distance between a first location 316 of the first via 304 and a second location 318 of the dielectric substrate 310 and/or to the microwave quantum circuit 312 located on the dielectric substrate 310. A second length of the second wirebond 314 can be based on a second distance between a third location 320 of the second via 306 and a fourth location 322 of the dielectric substrate 310 and/or to the microwave quantum circuit 312 located on the dielectric substrate 310. Further, the first length of the first wirebond 308 and the second length of the second wirebond 314 can be less than 2 millimeters (mms) according to some implementations.

The wirebonds (e.g., the first wirebond 308, the second wirebond 314) can comprise, for example, aluminum and/or niobium. Further, wirebonds (e.g., the first wirebond 308, the second wirebond 314) can comprise diameters in the range between approximately 15 micrometer (µm) and several hundred micrometers, wherein the upper end of the range can be utilized for high-powered applications. Further, a cover 324 can be placed over the printed circuit board 302, the dielectric substrate 310, the microwave quantum circuit 312, the first wirebond 308, and the second wirebond 314.

Another problem associated with traditional quantum devices (e.g., the quantum device 200) is that by cutting away a part of the printed circuit board (e.g., illustrated at 212 and 214 of FIG. 2), the characteristic impedance of the transmission line in the printed circuit board cannot be controlled. A solution provided by the disclosed aspects is that the transmission line (e.g., the first transmission line, the second transmission line) is inside the printed circuit board 302 and, therefore, the printed circuit board 302 does not need to be cut in order to make a connection with the wirebonds. Further the vias and/or transmission lines can be designed to be around 50 ohms, or another desired impedance. For example, the first via 304 can comprise a first defined characteristic impedance and the second via 306 can comprise a second defined characteristic impedance. According to some implementations, the first defined characteristic impedance and the second defined characteristic impedance can be different characteristic impedances. In some implementations, the first defined characteristic impedance and the second defined characteristic impedance can be a same characteristic impedance or a similar characteristic impedance.

The quantum computing device 300 can comprise one or more small copper vias under the printed circuit board 302. For example, the one or more small copper vias are illustrated as a first small via 324, a second small via 326, a third small via 328, and a fourth small via 330. The small vias (e.g., the first small via 324, the second small via 326, the third small via 328, and the fourth small via 330) can connect to another piece of copper 332 placed below the dielectric substrate 310. The piece of copper 332 can be utilized to improve the thermalization of the chip because for the quantum computing device 300 there is no bottom cover touching the dielectric substrate 310. It is noted that copper is utilized because copper is a good thermal conductor while the printed circuit board 302 and the dielectric substrate 310 are not good thermal conductors. Therefore, the small copper vias (e.g., the first small via 324, the second small via 326, the third small via 328, and the fourth small via 330) can thermalize the dielectric substrate 310. Further, by having shorter wirebonds (e.g., length reduced by via and/or dielectric layer location) as discussed herein, there can be a corresponding reduction and/or mitigation in crosstalk since the crosstalk can be proportional to the wirebond length.

Given the above problems with prior art superconducting devices, the various aspects provided herein can be implemented to produce a solution to one or more of these problems in the form of a superconducting device, superconducting circuit, and method of fabricating the same. Such systems, devices, circuits, methods, computer-implemented methods, and/or computer program products implementing such a superconducting device can have an advantage of reduction and/or mitigation of crosstalk, and/or an advantage of preserving characteristic impedance continuity, as compared to conventional techniques.

The quantum computing device 300 of FIG. 3 is illustrated with the dielectric substrate placed on top of the printed circuit board 302. For example, in FIG. 3, the dielectric substrate 310 can be formed over the printed circuit board 302 and can be operatively attached to the printed circuit board 302 via the first wirebond 308 between the first transmission line (e.g., the first via 304) and the dielectric substrate 310 and via the second wirebond 314 between the second transmission line (e.g., the second via 306) and the dielectric substrate 310.

Figure 4:
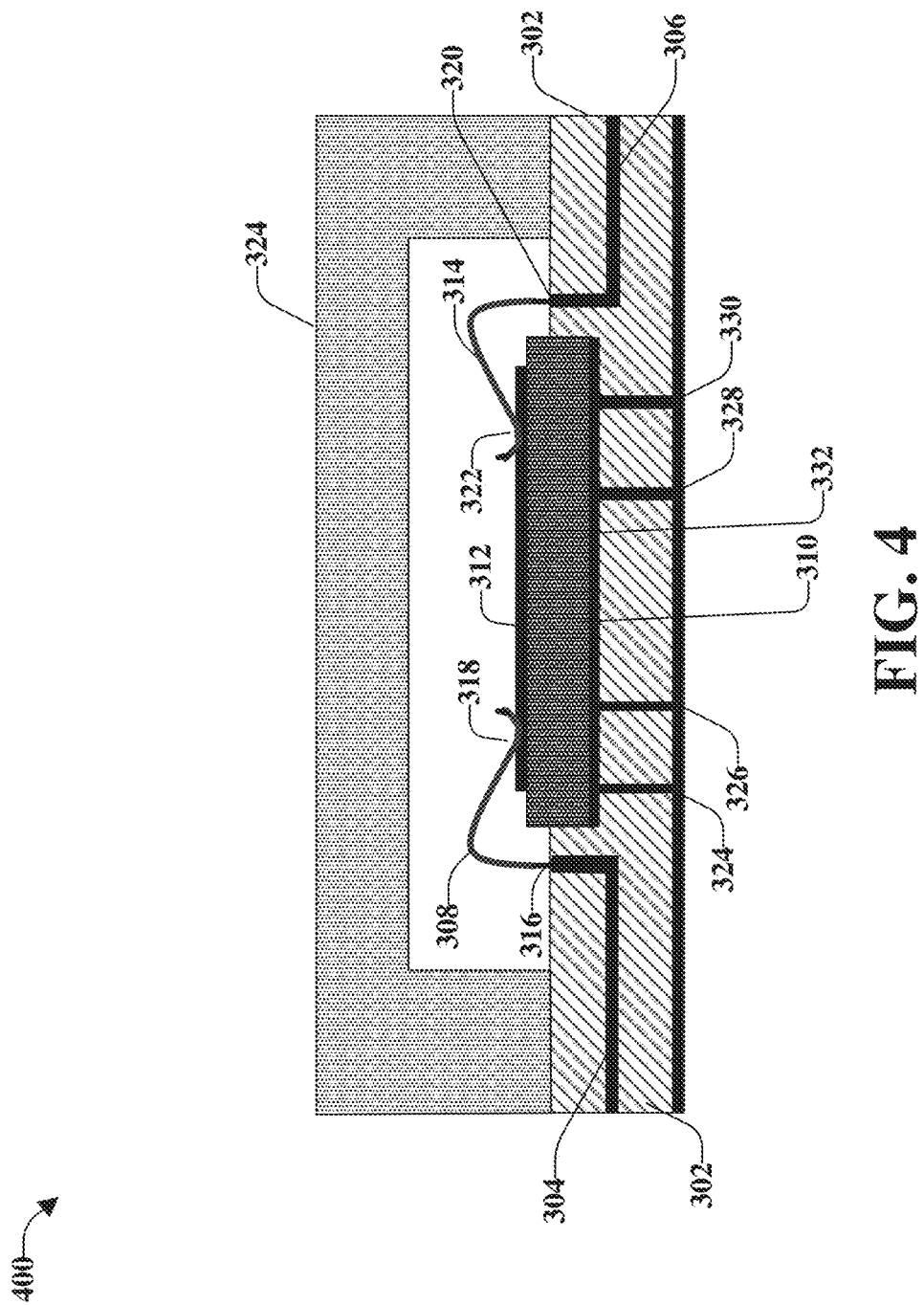
FIG. 4 illustrates an example, non-limiting, side-view of a portion of another quantum computing device in accordance with one or more embodiments described herein.

FIG. 4 illustrates an example, non-limiting, side-view of a portion of another a quantum computing device 400 in accordance with one or more embodiments described herein. Repetitive description of like elements employed in other embodiments described herein is omitted for sake of brevity. As illustrated, the dielectric substrate 310 of the quantum computing device 400 can be inserted, at least partially, inside the printed circuit board 302. In this embodiment, since a top of the dielectric substrate 310 is closer to the printed circuit board 302, the first length of the first wirebond 308 and the second length of the second wirebond 314 can be slightly shorter in length than the wirebonds utilized for the quantum computing device 300 of FIG. 3.

Figure 5:
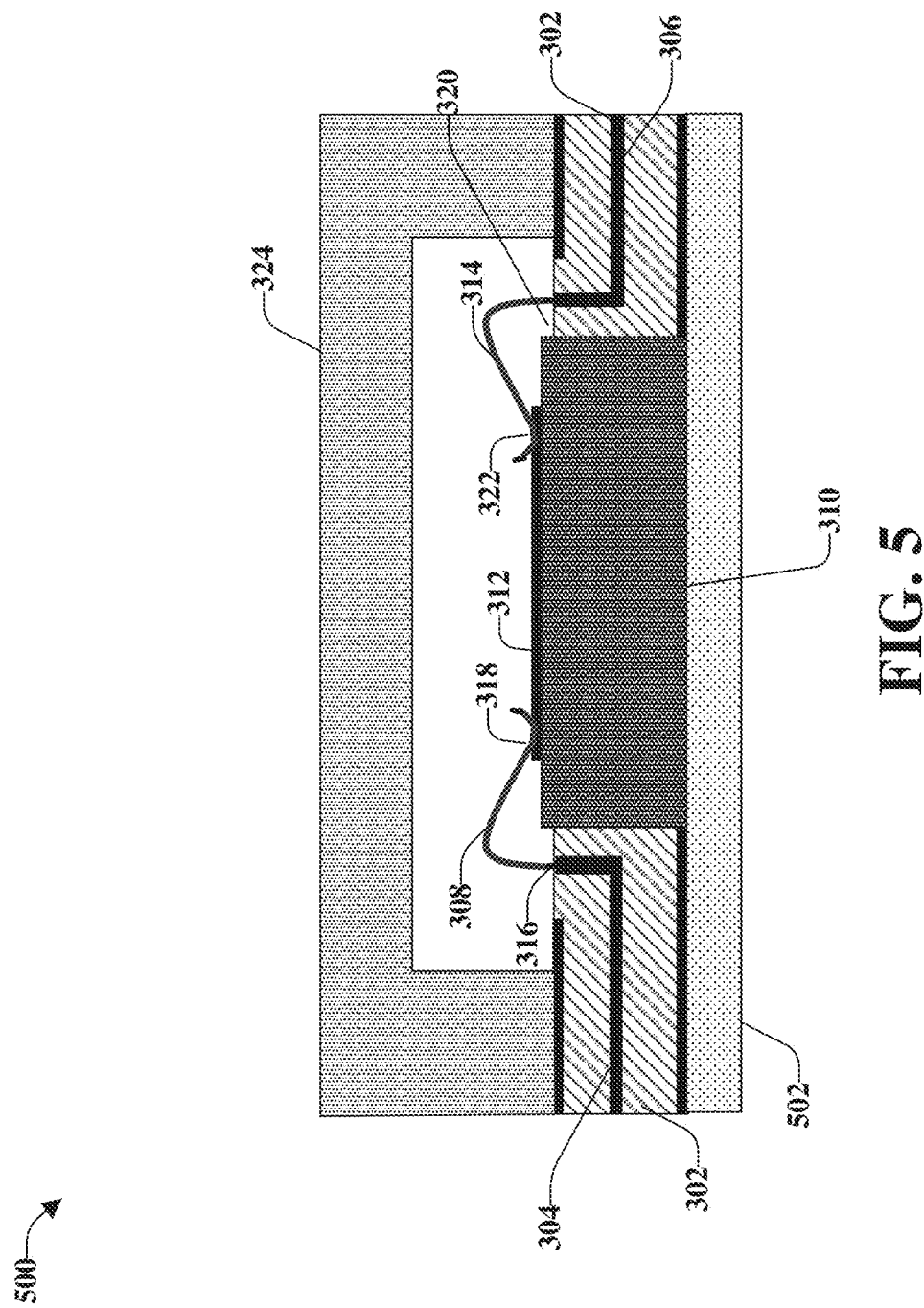
FIG. 5 illustrates an example, non-limiting, side-view of a portion of yet another quantum computing device in accordance with one or more embodiments described herein.

FIG. 5 illustrates an example, non-limiting, side-view of a portion of yet another quantum computing device 500 in accordance with one or more embodiments described herein. Repetitive description of like elements employed in other embodiments described herein is omitted for sake of brevity. As illustrated, a top of the dielectric substrate 310 of the quantum computing device 500 can be substantially the same height as a top of the printed circuit board 302.

In the embodiment of FIG. 5, a bottom cover 502 can be utilized to support both the dielectric substrate 310 and the printed circuit board 402. For example, a bottom of the printed circuit board 302 and a bottom of the dielectric substrate 310 can be supported on the bottom cover 502.

Figure 6:
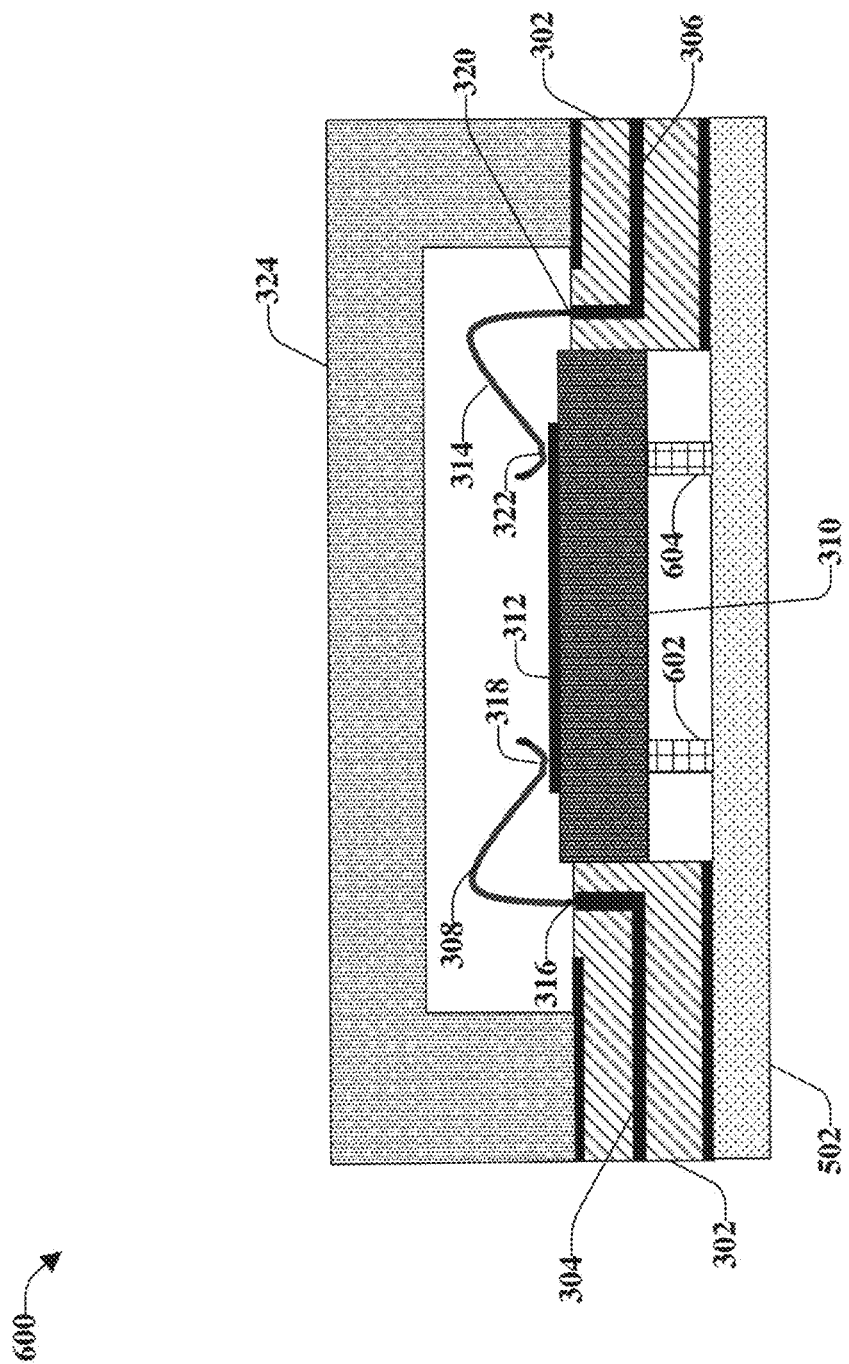
FIG. 6 illustrates an example, non-limiting, side-view of a portion of another quantum computing device in accordance with one or more embodiments described herein.

FIG. 6 illustrates an example, non-limiting, side-view of a portion of another quantum computing device 600 in accordance with one or more embodiments described herein. Repetitive description of like elements employed in other embodiments described herein is omitted for sake of brevity.

As illustrated, heights of the dielectric substrate 310 and the printed circuit board 302 can be different. Due to the height differences between the dielectric substrate 310 and the printed circuit board 302, one or more pillars or other support structures can be utilized to support the dielectric substrate on the bottom cover 502. For example, as illustrated a first pillar 602 and a second pillar 604 can support the dielectric substrate 310. However, it is noted that in some cases a single pillar can be utilized to support the dielectric substrate 310 and/or more than two pillars can be utilized to support the dielectric substrate 310.

There are a few advantages of the quantum computing device 300, the quantum computing device 400, the quantum computing device 500, and/or the quantum computing device 600 as compared with traditional quantum devices, including the quantum device 200, of FIG. 2. First, the one or more vias (e.g., the first via 304, the second via 306) inside the printed circuit board 302 can be designed to be around 50 ohms. For example, a diameter of the vias can be selected such that the vias are 50 ohms. Accordingly, the 50-ohm transition from the printed circuit board 302 to the dielectric substrate 310 can be improved with the disclosed aspects Another advantage is that having the dielectric substrate 310 in close proximity to the vias (e.g., the first via 304, the second via 306), the wirebond (e.g., the first wirebond 308, the second wirebond 314) can be shorter as compared to the first wirebond 216 and the second wirebond 218 of FIG. 2. By being shorter, the wirebonds can be at the 50-ohm transition because the length of the wirebond is linearly related with the inductance of the transition. Therefore, the shorter the wire, the better the 50-ohm approximation can be.

Another benefit is that the shorter the wirebond, the lower will be the mutual inductance between near wirebonds, which can enable a reduction and/or mitigation of crosstalk below the minus 50 dB (−50 dB) threshold that is utilized for quantum applications.

The various aspects provide a printed circuit board (e.g., the printed circuit board 302) to dielectric substrate (e.g., the dielectric substrate 310 and/or the microwave quantum circuit 312) transition with controlled impedance and reduced and/or mitigated crosstalk without difficult to make vias (e.g., the first via 304, the second via 306). Further, the disclosed aspects can utilize non-superconducting printed circuit boards (e.g., the printed circuit board 302) to improve thermalization (because superconductors are poor thermal conductors). For example, superconductors are materials that exhibit certain properties when cooled down to a certain temperature. When such materials reach a specific temperature, the materials become near ideal conductors with a resistance of around zero ohms. Accordingly, current in a superconductor can flow without much, if any, loss. Further, superconductors are highly sensitive to noise and possible corruption (e.g., crosstalk) of transmission signals which can be critical to performing an application.

For the disclosed aspects, intrusion of a potential destructive form of interference is disclosed within a circuit that can impact superconductor data integrity and compromise its functionality along with the disclosed aspects to mitigate such negative impact. In addition, the various aspects provided herein are easier to implement than traditional devices and utilize only non-superconducting materials for the packing in order to improve thermal conductivity.

FIG. 7 illustrates an example, non-limiting, printed circuit board 700 utilized in a simulation in accordance with one or more embodiments described herein. Repetitive description of like elements employed in other embodiments described herein is omitted for sake of brevity.

There can be, for example, two transmission lines (e.g., a first transmission line 702 and a second transmission line 704) embedded into the printed circuit board 700. Further, there can be four vias (e.g., a first via 706, a second via 708, a third via 710, and a fourth via 712) that can be utilized to implement the transition using the wirebonds (e.g., a first wirebond 714, a second wirebond 716, a third wirebond 718, and a fourth wirebond 720). The first transmission line 702 can be between a first port 722 (P1) and a second port 724 (P2). The second transmission line 704 can be between a third port 726 (P3) and a fourth port 728 (P4). In an example, a wirebond can connect the first transmission line 702 to an attenuator and another wirebond can connect the attenuator to the second transmission line 704.

As illustrated, the transmission lines (e.g., the first transmission line 702, the second transmission line 704) in the printed circuit board 700 were intentionally designed to be around 47 ohms such that if there is a shift from 47 ohms, it can be determined how much the wirebond and the via are impacting the 50-ohm transition quality of the overall design. The distance between two components, namely, a first component 730 and a second component 732 (e.g., the one or more components) is around 1.5 mm, which is very close or similar to the dimensions utilized in a practical application.

FIG. 8 illustrates an example, non-limiting, graph 800 of time domain reflectometry results of the simulation of the printed circuit board 700 of FIG. 7 in accordance with one or more embodiments described herein. Time, in nanoseconds (ns), is illustrated on the horizontal axis 802 and ohms is illustrated on the vertical axis 804.

The time domain reflectometry (TDR) provides the value of the characteristic impedance along the lines (e.g., the first transmission line 702 and the second transmission line 704). The impedance of the first line (e.g., TDRZ(1)) is illustrated by first line 806 and the impedance of the second line (e.g., TDRZ(2)) is illustrated by the second line 808.

The first transmission line 702 of the printed circuit board 700 (e.g., the 47-ohm line) was used intentionally, as well as a 50-ohm stripline on a silicon (Si) dielectric substrate. As illustrated the result spikes, at 810 of the graph 800, above 50 ohms almost by a factor of three ohms. The spike is referred to as an inductive overshot, which is caused by the wirebond. Making the wirebond shorter might improve the inductive overshot. However, the disclosed aspects already improve this overshot as compared to a spike of 70 ohms or higher with conventional designs. After the overshot at 802, the result returns to 47 ohms, which was the value used in the simulation associated with FIG. 7.

FIG. 9 illustrates an example, non-limiting, graph 900 of scattering parameter results of the simulation of the printed circuit board 700 of FIG. 7 in accordance with one or more embodiments described herein. Frequency, in gigahertz (GHz), is illustrated on the horizontal axis 902 and decibels (dB) is illustrated on the vertical axis 904. Although the frequency is illustrated between 0 GHz and 20 GHz, it is noted that 20 GHz can be beyond what is needed for quantum applications.

The first line 906 represents dB(S(1,1)) and is the reflection portion and indicates that if energy is put into the first port 722, only a small amount of the energy returns to the power source. For example, the reflection is below minus 10 dB (<−10 dB). The second line 908 represents dB(S(1,2)), which illustrates the energy that flows without attenuation from port 1 (e.g., the first port 722) to port 2 (e.g., the second port 724).

The third line 910 represents dB(S(1,4)), which represents the crosstalk between the first port 722 and the third port 726 (e.g., the energy leaking from the first port 722 to the third port 726). The fourth line 912 represents dB(S(1,3)), which represents the crosstalk between the first port 722 and the fourth port 728 (e.g., the energy leaking from the first port 722 to the fourth port 728).

As illustrated, the crosstalk is below minus 50 dB (<−50 db) up to 20 GHz. Considering for quantum applications this is more than enough because usually superconducting qubits work at 5 GHz or below 10 GHz. Accordingly, the graph 900 is illustrating that the disclosed aspects are effective at higher frequencies. Also, the simulation demonstrates that having the printed circuit board with one or more vias and one or more wirebond transitions, as discussed herein, can improve the characteristic impedance and the crosstalk of the design.

Figure 10:
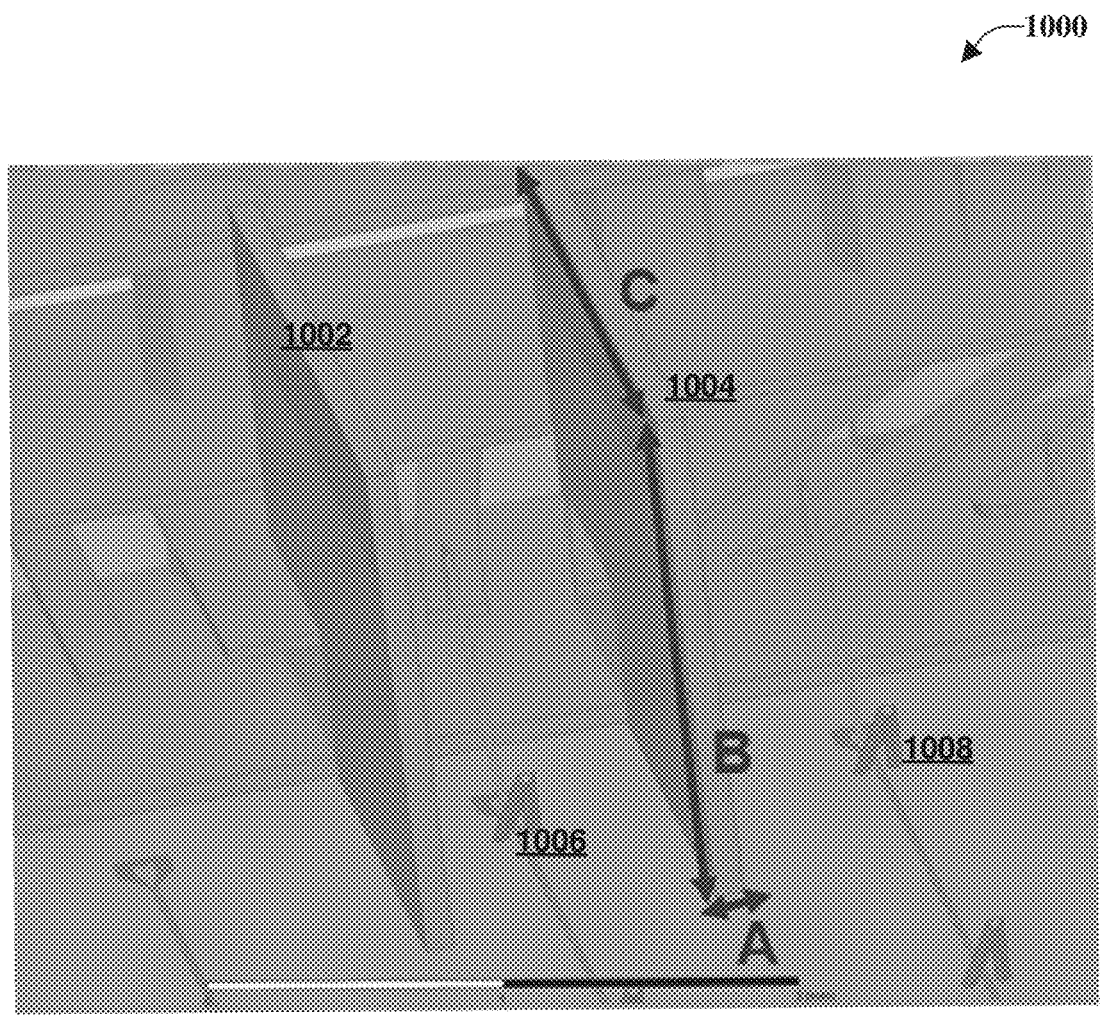
FIG. 10 illustrates a portion of a quantum device that utilizes magnetic shielding walls in accordance with one or more embodiments described herein.

According to some implementations, crosstalk can be further reduced and/or mitigated using copper (Cu) walls. For example, FIG. 10 illustrates a portion of a quantum device 1000 that utilizes magnetic shielding walls in accordance with one or more embodiments described herein.

A first shielding wall 1002 and a second shielding wall 1004 can be on opposite sides of a wirebond 1006. Thus, the first shielding wall 1002 and the second shielding wall 1004 can isolate the wirebond 1006. The shielding walls, illustrated with respect to the second shielding wall 1004, can have dimensions (A (width), B (height) and C (length)) as shown isolating wirebonds.

Thicknesses (A) of the shielding walls (e.g., the first shielding wall 1002, the second shielding wall 1004), using non-superconducting material such as copper, can be greater than skin depth. If the shielding wall (e.g., the first shielding wall 1002, the second shielding wall 1004) is made from type-I superconductor material (e.g., aluminum), the thickness can be limited by London penetration (London penetration depth defines thicknesses in which supercurrents flow to counteract external magnetic field).

In at least one non-limiting embodiment, the length (C) of the shielding wall (e.g., the first shielding wall 1002, the second shielding wall 1004) can be at least 5× the length of the wirebond 1006 extension. Further, the height (B) of the shielding wall (e.g., the first shielding wall 1002, the second shielding wall 1004) can be at least 2× the height of wirebond 1006.

According to some implementations, the shielding walls (e.g., the first shielding wall 1002, the second shielding wall 1004), can be constructed as part of fabrication of a circuit. In alternative implementations, the shielding walls (e.g., the first shielding wall 1002, the second shielding wall 1004), can be soldered in place after fabrication of the circuit. It is appreciated that dimension ratios can be varied in embodiments as a function of various parameters and conditions.

Figure 11B:
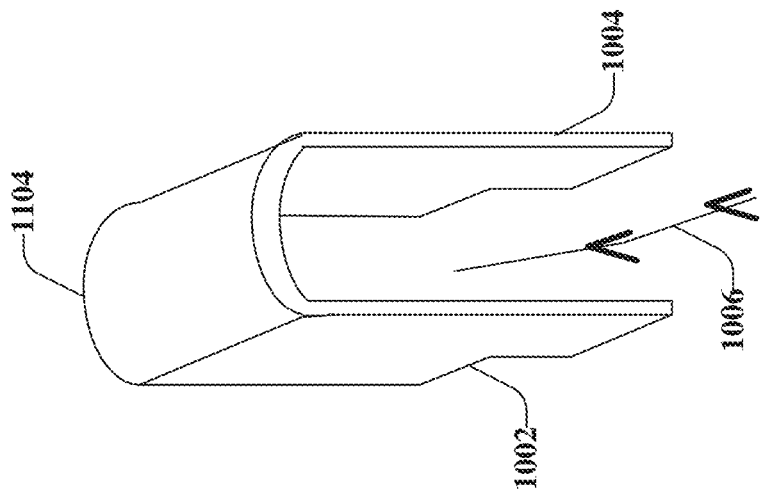
FIGS. 11A and 11B illustrate alternative embodiments of shielding walls in accordance with one or more embodiments described herein.
Figure 11A:
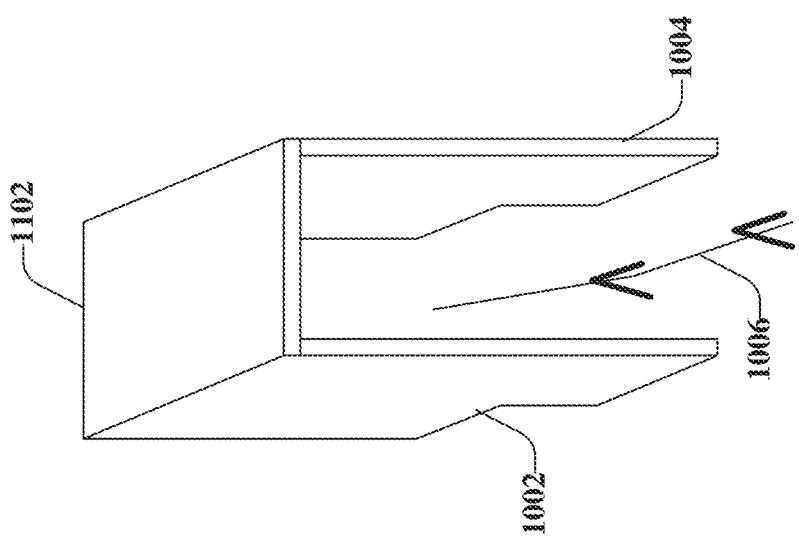

FIGS. 11A and 11B illustrate alternative embodiments of shielding walls in accordance with one or more embodiments described herein. Repetitive description of like elements employed in other embodiments described herein is omitted for sake of brevity.

As illustrated, the magnetic shielding walls (e.g., the first shielding wall 1002, the second shielding wall 1004) can include a roof and/or enclosing portions 1102, 1104. The roof or enclosing portions 1102, 1104 can be flat (as illustrated in FIG. 11A), curved (as illustrated in FIG. 11B), solid or not solid as desired to facilitate mitigation of crosstalk across respective wirebonds. It is to be appreciated that any suitable magnetic shielding material and wall thickness, height and depth can be utilized in connection with mitigating crosstalk levels to below −50 dB in accordance with desired ranges for super-conducting quantum circuit applications.

Figure 12:
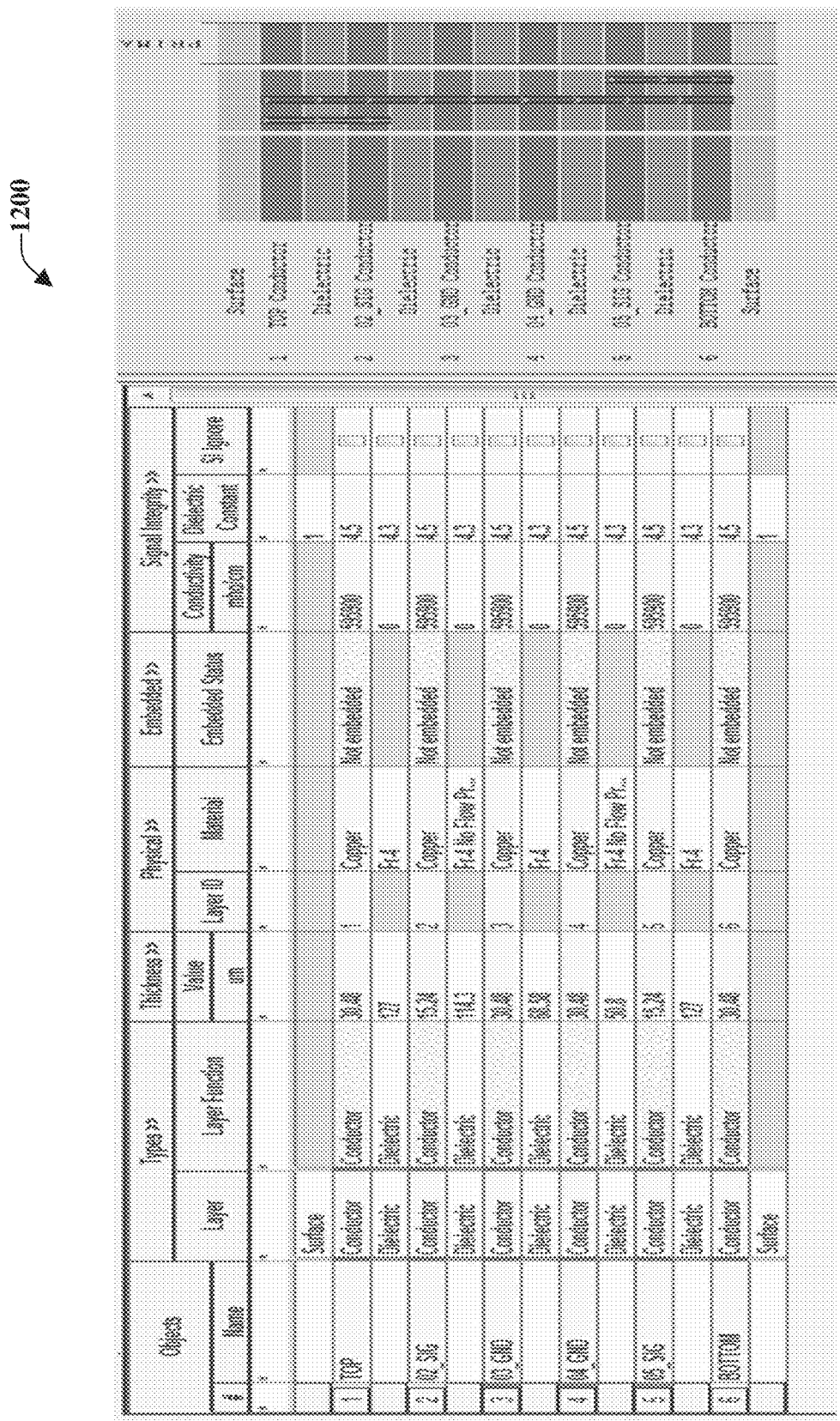
FIG. 12 illustrates an example, non-limiting, implementation for a multi-layer printed circuit board in accordance with one or more embodiments described herein.

FIG. 12 illustrates an example, non-limiting, implementation 1200 for a multi-layer printed circuit board in accordance with one or more embodiments described herein. The multi-layer printed circuit board can be stacked printed circuit boards. Illustrated are possible dimensions for the different layers (e.g., the substrate, the dielectric layer, the metal thickness of the transmission line, and so on). It is noted that these values and/or materials are for example purposes only and the disclosed aspects are not meant to be limited to the implementation 1200 illustrated in FIG. 12.

Figure 13:
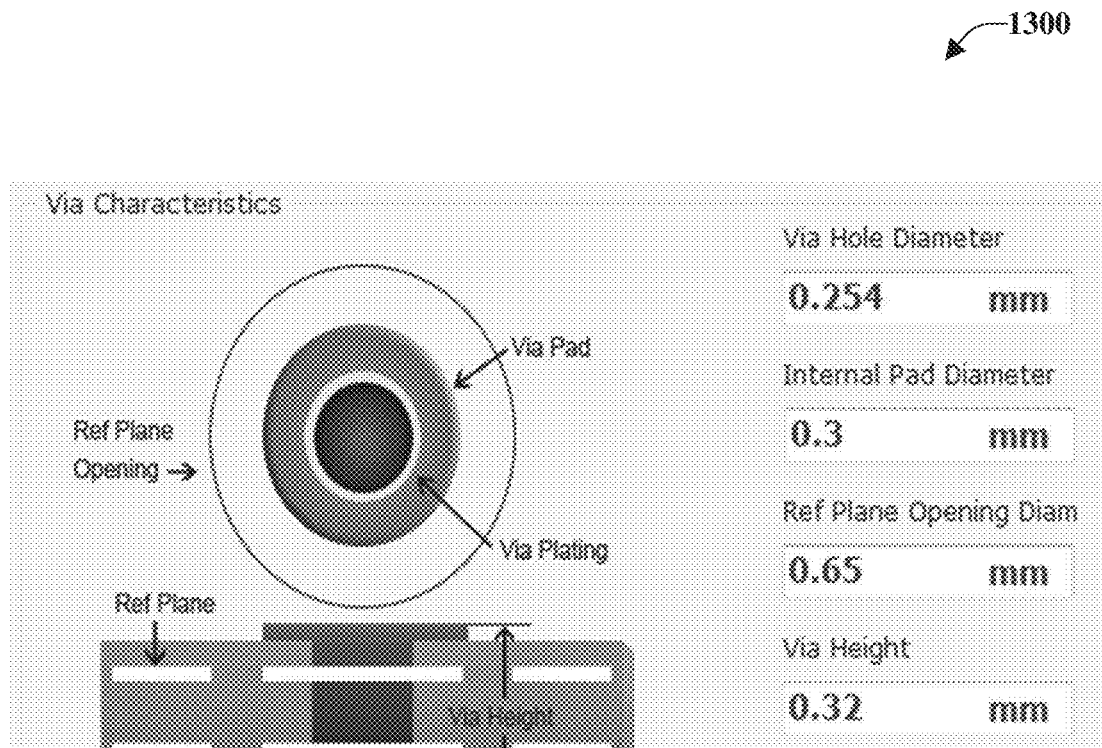
FIG. 13 illustrates example, non-limiting, via dimensions in accordance with one or more embodiments described herein.

FIG. 13 illustrates example, non-limiting, via dimensions 1300 in accordance with one or more embodiments described herein. The via dimensions 1300 can be selected such that a 50-ohm transition is achieved. It is noted that these values are for example purposes only and the disclosed aspects are not meant to be limited to the illustrated via dimensions 1300. It is further noted that FIGS. 12 and 13 are provided to demonstrate that various software programs can be utilized to determine whether a particular design can achieve the 50-ohm result in accordance with the various aspects provide herein.

Figure 14:
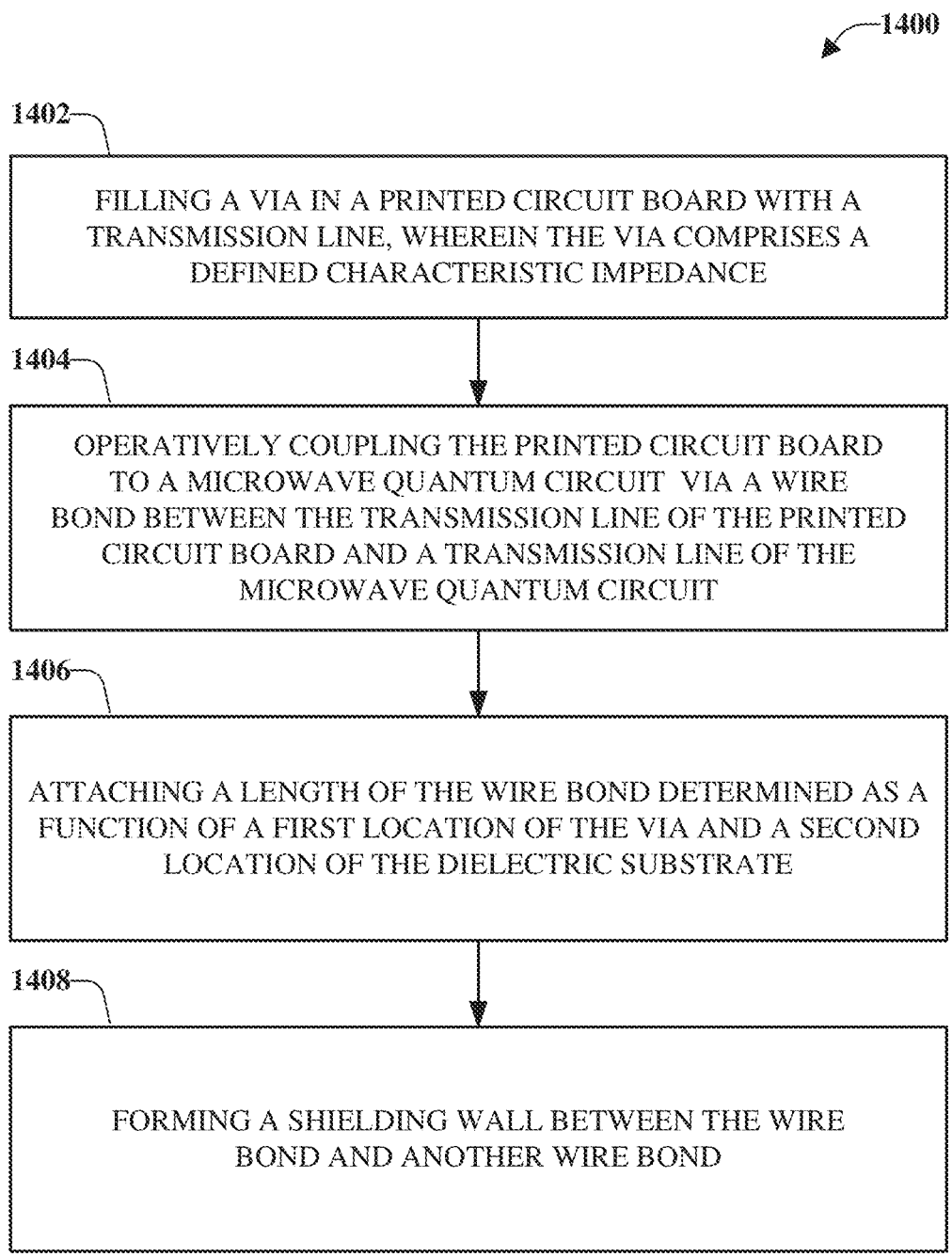
FIG. 14 illustrates a flow diagram of an example, non-limiting, method for fabrication of an integrated circuit in accordance with one or more embodiments described herein.

FIG. 14 illustrates a flow diagram of an example, non-limiting, method 1400 for fabrication of an integrated circuit in accordance with one or more embodiments described herein. Repetitive description of like elements employed in other embodiments described herein is omitted for sake of brevity.

The method 1400 starts at 1402, when a via (e.g., the first via 304, the second via 306) in a printed circuit board (e.g., the printed circuit board 302) is filled with a transmission line. The via can comprise a defined characteristic impedance. Further, at 1404, the printed circuit board can be operatively coupled to a microwave quantum circuit (e.g., the microwave quantum circuit 312, one or more transmission lines) via a wirebond (e.g., the first wirebond 308, the second wirebond 314) between the transmission line of the printed circuit board and a transmission line of the microwave quantum circuit. The wirebond can be configured to carry microwave signals between the printed circuit board and the microwave quantum circuit.

According to some implementations, the method 1400 can comprise, at 1406, attaching a length of the wirebond determined as a function of a first location (e.g., the first location 316, the third location 320) of the via and a second location (e.g., the second location 318, the fourth location 322) of the dielectric substrate.

In some implementations, the dielectric substrate can be formed over the printed circuit board. In other implementations, the dielectric substrate can be formed, at least partially, inside the printed circuit board.

In some implementations, the method 1400 can also comprise, at 1408, forming a shielding wall (e.g., the first shielding wall 1002, the second shielding wall 1004) between the wirebond and another wirebond. For example, a first shielding wall can be placed on a first side of the wirebond and a second shielding wall can be placed on a second side of the wirebond. The first shielding wall and the second shielding wall can isolate the wirebond from other, adjacent wirebonds.

As discussed herein, provided is a method for printed circuit board to dielectric substrate transition with controlled impedance and reduced and/or mitigated crosstalk. The printed circuit board can be designed to reduce and/or mitigate crosstalk between adjacent lines (e.g., wirebonds). Inside a printed circuit board, one or more vias with desired characteristic impedance can be inserted. Further, short wirebonds (e.g., <2 mm) can provide a microwave signal connection from the printed circuit board vias to transmission lines on a dielectric substrate (DIE). Further, in an optional implementation, metal walls can be used to further reduce and/or mitigate crosstalk between wirebonds. In alternative or additional implementations, additional ground vias can be used to reduce and/or mitigate crosstalk between vias. The method can be used but is not limited to the interconnection of: quantum devices and integrated components (e.g., a superconductor package) for cryogenic applications (like attenuators, High Electron Mobility Transistor (HEMT), Low Noise Amplifier (LNA), and so on).

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 15:
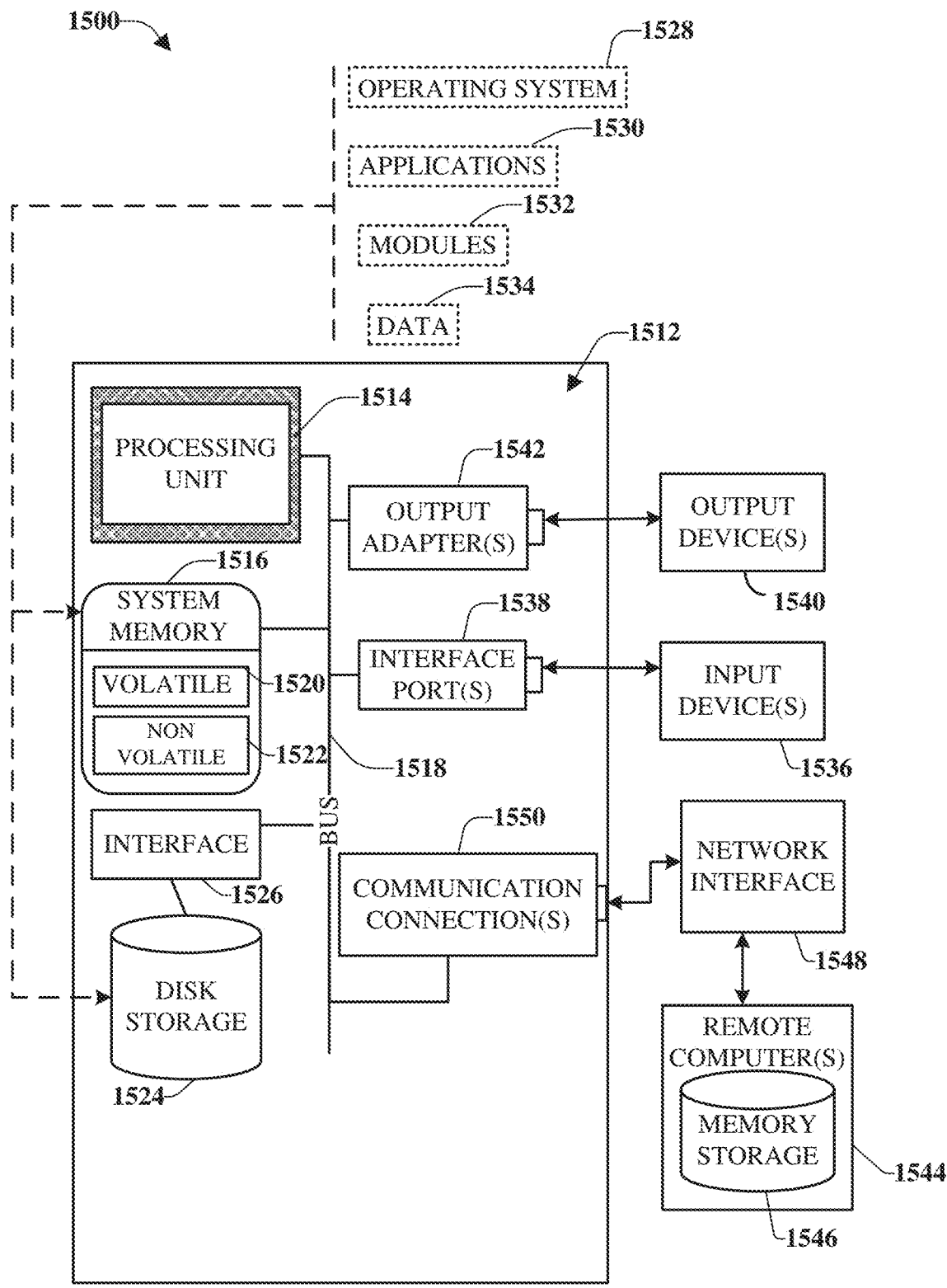
FIG. 15 illustrates a block diagram of an example, non-limiting operating environment in which one or more embodiments described herein can be facilitated.

In order to provide a context for the various aspects of the disclosed subject matter, FIG. 15 as well as the following discussion are intended to provide a general description of a suitable environment in which the various aspects of the disclosed subject matter can be implemented. FIG. 15 illustrates a block diagram of an example, non-limiting operating environment in which one or more embodiments described herein can be facilitated. Repetitive description of like elements employed in other embodiments described herein is omitted for sake of brevity. With reference to FIG. 15, a suitable operating environment 1500 for implementing various aspects of this disclosure can also include a computer 1512. The computer 1512 can also include a processing unit 1514, a system memory 1516, and a system bus 1518. The system bus 1518 couples system components including, but not limited to, the system memory 1516 to the processing unit 1514. The processing unit 1514 can be any of various available processors. Dual microprocessors and other multiprocessor architectures also can be employed as the processing unit 1514. The system bus 1518 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1516 can also include volatile memory 1520 and nonvolatile memory 1522. The basic input/output system (BIOS), containing the basic routines to transfer information between elements within the computer 1512, such as during start-up, is stored in nonvolatile memory 1522. By way of illustration, and not limitation, nonvolatile memory 1522 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1520 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1512 can also include removable/non-removable, volatile/non-volatile computer storage media. FIG. 15 illustrates, for example, a disk storage 1524. Disk storage 1524 can also include, but is not limited to, devices like a magnetic disk drive, floppy disk drive, tape drive, Jaz drive, Zip drive, LS-100 drive, flash memory card, or memory stick. The disk storage 1524 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1524 to the system bus 1518, a removable or non-removable interface is typically used, such as interface 1526. FIG. 15 also depicts software that acts as an intermediary between users and the basic computer resources described in the suitable operating environment 1500. Such software can also include, for example, an operating system 1528. Operating system 1528, which can be stored on disk storage 1524, acts to control and allocate resources of the computer 1512. System applications 1530 take advantage of the management of resources by operating system 1528 through program modules 1532 and program data 1534, e.g., stored either in system memory 1516 or on disk storage 1524. It is to be appreciated that this disclosure can be implemented with various operating systems or combinations of operating systems. A user enters commands or information into the computer 1512 through input device(s) 1536. Input devices 1536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1514 through the system bus 1518 via interface port(s) 1538. Interface port(s) 1538 include, for example, a serial port, a parallel port, a game port, and a universal serial bus (USB). Output device(s) 1540 use some of the same type of ports as input device(s) 1536. Thus, for example, a USB port can be used to provide input to computer 1512, and to output information from computer 1512 to an output device 1540. Output adapter 1542 is provided to illustrate that there are some output devices 1540 like monitors, speakers, and printers, among other output devices 1540, which require special adapters. The output adapters 1542 include, by way of illustration and not limitation, video and sound cards that provide a method of connection between the output device 1540 and the system bus 1518. It should be noted that other devices and/or systems of devices provide both input and output capabilities such as remote computer(s) 1544.

Computer 1512 can operate in a networked environment using logical connections to one or more remote computers, such as remote computer(s) 1544. The remote computer(s) 1544 can be a computer, a server, a router, a network PC, a workstation, a microprocessor based appliance, a peer device or other common network node and the like, and typically can also include many or all of the elements described relative to computer 1512. For purposes of brevity, only a memory storage device 1546 is illustrated with remote computer(s) 1544. Remote computer(s) 1544 is logically connected to computer 1512 through a network interface 1548 and then physically connected via communication connection 1550. Network interface 1548 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1550 refers to the hardware/software employed to connect the network interface 1548 to the system bus 1518. While communication connection 1550 is shown for illustrative clarity inside computer 1512, it can also be external to computer 1512. The hardware/software for connection to the network interface 1548 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum device, comprising:
    a microwave quantum circuit on a dielectric substrate; and
    a printed circuit board comprising a via that comprises a first transmission line, wherein a wirebond between the first transmission line of the printed circuit board and a second transmission line of the microwave quantum circuit operatively couples the microwave quantum circuit to the printed circuit board, and wherein the via comprises a diameter configured to produce a first defined characteristic impedance of the first transmission line that matches a second defined characteristic impedance of the second transmission line of the microwave quantum circuit.

2. The quantum device of claim 1, wherein a length of the wirebond is based on a first location of the via and a second location of the dielectric substrate.

3. The quantum device of claim 1, wherein the dielectric substrate is formed over the printed circuit board.

4. The quantum device of claim 1, wherein the dielectric substrate is formed, at least partially, inside the printed circuit board.

5. The quantum device of claim 1, further comprising:
    a cover that supports the printed circuit board and the dielectric substrate.

6. The quantum device of claim 1, further comprising a cover over the printed circuit board and the dielectric substrate.

7. The quantum device of claim 1, further comprising a shielding wall between the wirebond and another wirebond.

8. The quantum device of claim 1, wherein the printed circuit board comprises a ground via that reduces crosstalk between the via and another via.

9. The quantum device of claim 1 is a quantum computing device.

10. The quantum device of claim 1, wherein the via further comprises the diameter and a via height configured to produce the first defined characteristic impedance.

11. The quantum device of claim 1, wherein the via further comprises the diameter and a via plating thickness configured to produce the first defined characteristic impedance.

12. The quantum device of claim 1, wherein the via further comprises the diameter and a via internal pad diameter configured to produce the first defined characteristic impedance.

13. The quantum device of claim 1, wherein the via further comprises the diameter and a via reference plane opening diameter configured to produce the first defined characteristic impedance.

14. An integrated circuit, comprising:
    a microwave quantum circuit on a dielectric substrate;
    a printed circuit board comprising a via that comprises a first transmission line, wherein the printed circuit board is operatively coupled to the dielectric substrate via a wirebond between the first transmission line of the printed circuit board and a second transmission line of the microwave quantum circuit, and wherein the via comprises a diameter selected to produce a first defined characteristic impedance of the first transmission line that matches a second defined characteristic impedance of the second transmission line of the microwave quantum circuit.

15. The integrated circuit of claim 14, wherein a length of the wirebond is selected as a function of a first location of the via and a second location of the dielectric substrate.

16. The integrated circuit of claim 14, wherein the dielectric substrate is formed over the printed circuit board.

17. The integrated circuit of claim 14, wherein the dielectric substrate is formed, at least partially, inside the printed circuit board.

18. The integrated circuit of claim 14, further comprising:
a cover that supports the printed circuit board and the dielectric substrate.

19. The integrated circuit of claim 14, wherein the via further comprises the diameter and a via height configured to produce the first defined characteristic impedance.

20. The integrated circuit of claim 14, wherein the via further comprises the diameter and a via plating thickness selected to produce a first defined characteristic impedance.

21. The integrated circuit of claim 14, wherein the via further comprises the diameter and a via internal pad diameter selected to produce a first defined characteristic impedance.

22. A device package, comprising:
a printed circuit board comprising a first via comprising a first transmission line and a second via comprising a second transmission line, wherein the first via comprises a first diameter selected to produce a first defined characteristic impedance of the first transmission line and the second via comprises a second diameter selected to produce a second defined characteristic impedance of the second transmission line; and
a microwave quantum circuit on a dielectric substrate formed over the printed circuit board, wherein the microwave quantum circuit is operatively attached to the printed circuit board via a first wirebond between the first transmission line of the printed circuit board and a third transmission line of the microwave quantum circuit and via a second wirebond between the second transmission line of the printed circuit board and a fourth transmission line of the microwave quantum circuit, wherein the first defined characteristic impedance is selected to match a third defined characteristic impedance of the third transmission line of the microwave quantum circuit.

23. The device package of claim 22, wherein a first length of the first wirebond is based on a first location of the first via and a first location of the dielectric substrate, and wherein a second length of the second wirebond is based on a first location of the second via and a second location of the dielectric substrate.

24. A device package, comprising:
a printed circuit board comprising a first via comprising a first transmission line and a second via comprising a second transmission line, wherein the first via comprises a first diameter selected to produce a first defined characteristic impedance of the first transmission line and the second via comprises a second diameter selected to produce a second defined characteristic impedance of the second transmission line; and
a microwave quantum circuit on a dielectric substrate formed, at least in part, inside the printed circuit board, wherein the microwave quantum circuit is operatively coupled to the printed circuit board via a first wirebond between the first transmission line of the printed circuit board and a third transmission line of the microwave quantum circuit and a second wirebond between the second transmission line of the printed circuit board and a fourth transmission line of the microwave quantum circuit, wherein the first defined characteristic impedance is selected to match a third defined characteristic impedance of the third transmission line of the microwave quantum circuit.

25. The device package of claim 24, wherein a first length of the first wirebond is based on a first location of the first via and a first location of the dielectric substrate; and wherein a second length of the second wirebond is based on a first location of the second via and the second location of the dielectric substrate.

* * * * *